(12) United States Patent
Sun et al.

(10) Patent No.: US 12,174,480 B2
(45) Date of Patent: Dec. 24, 2024

(54) DISPLAY PANEL AND SPLICING DISPLAY PANEL

(71) Applicant: TCL China Star Optoelectronics Technology Co., Ltd., Guangdong (CN)

(72) Inventors: Hejing Sun, Guangdong (CN); Zhongpeng Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/790,171

(22) PCT Filed: Jun. 29, 2022

(86) PCT No.: PCT/CN2022/102279
§ 371 (c)(1),
(2) Date: Jun. 30, 2022

(87) PCT Pub. No.: WO2023/231118
PCT Pub. Date: Jul. 12, 2023

(65) Prior Publication Data
US 2024/0176179 A1    May 30, 2024

(30) Foreign Application Priority Data

May 31, 2022 (CN) .......................... 202210610186.7

(51) Int. Cl.
*G02F 1/1335* (2006.01)
*G02F 1/1333* (2006.01)
(Continued)

(52) U.S. Cl.
CPC .... *G02F 1/133504* (2013.01); *G02F 1/13336* (2013.01); *H01L 25/167* (2013.01); *H01L 33/58* (2013.01)

(58) Field of Classification Search
CPC .......... G02F 1/133504; G02F 1/13336; H01L 25/167; H01L 33/58; G09F 9/302; G09F 9/3026
See application file for complete search history.

(56) References Cited

U.S. PATENT DOCUMENTS

| 7,755,263 B2 | 7/2010 | Park et al. |
| 10,852,572 B2 | 12/2020 | Nishimura et al. |

(Continued)

FOREIGN PATENT DOCUMENTS

| CN | 101819375 | 9/2010 |
| CN | 102062969 | 5/2011 |

(Continued)

OTHER PUBLICATIONS

International Search Report and the Written Opinion Dated Dec. 21, 2022 From the International Searching Authority Re. Application No. PCT/CN2022/102279 and Its Translation Into English. (19 Pages).

(Continued)

*Primary Examiner* — Kevin Quarterman (57) ABSTRACT

An embodiment of the present application discloses a display panel and a splicing display panel. The display panel includes a display panel main body and a light grating layer. The light grating layer is formed on the display panel main body. The light grating layer includes a plurality of light gratings, and the light gratings are arranged at intervals along a first direction. The light gratings are arranged at intervals along a second direction, and the first direction intersects the second direction.

9 Claims, 6 Drawing Sheets

(51) Int. Cl.
  *H01L 25/16* (2023.01)
  *H01L 33/58* (2010.01)

(56) References Cited

U.S. PATENT DOCUMENTS

| | | | |
|---|---|---|---|
| 2008/0144179 A1 | 6/2008 | Mimura et al. | |
| 2016/0049012 A1 | 2/2016 | Torii et al. | |
| 2022/0107533 A1* | 4/2022 | Yang | G02F 1/133617 |
| 2022/0278174 A1* | 9/2022 | Yu | G02F 1/133504 |
| 2022/0317513 A1* | 10/2022 | Huang | G02F 1/133519 |

FOREIGN PATENT DOCUMENTS

| | | |
|---|---|---|
| CN | 102194382 | 9/2011 |
| CN | 102736317 | 10/2012 |
| CN | 203025421 | 6/2013 |
| CN | 104597665 | 5/2015 |
| CN | 104749787 | 7/2015 |
| CN | 107111022 | 8/2017 |
| CN | 109387889 | 2/2019 |
| CN | 109410780 | 3/2019 |
| CN | 110133939 | 8/2019 |
| CN | 111564119 | 8/2020 |
| CN | 111755491 | 10/2020 |
| CN | 112767849 | 5/2021 |
| CN | 113270049 | 8/2021 |
| CN | 114137753 | 3/2022 |
| CN | 114966928 | 8/2022 |
| JP | 2006-313360 | 11/2006 |
| JP | 2008-107404 | 5/2008 |
| JP | 2011-141498 | 7/2011 |
| JP | 2016-062092 | 4/2016 |
| JP | 2019-095652 | 6/2019 |
| TW | 201207509 | 2/2012 |

OTHER PUBLICATIONS

Notification of Office Action and Search Report Dated Dec. 19, 2022 From the State Intellectual Property Office of the People's Republic of China Re. Application No. 202210610186.7 and Its Translation Into English. (22 Pages).

Notice of Reasons for Refusal Dated Aug. 13, 2024 From the Japan Patent Office Re. Application No. 2022-576557 and Its Translation Into English. (12 Pages).

* cited by examiner

DISPLAY PANEL AND SPLICING DISPLAY PANEL

RELATED APPLICATIONS

This application is a National Phase of PCT Patent Application No. PCT/CN2022/102279 having International filing date of Jun. 29, 2022, which claims the benefit of priority of China Patent Application No. 202210610186.7 filed on May 31, 2022. The contents of the above applications are all incorporated by reference as if fully set forth herein in their entirety.

FIELD AND BACKGROUND OF THE INVENTION

The present application relates to a field of display technologies, especially to a display panel and a splicing display panel.

In a splicing display panel of liquid crystal display panels and light emitting diode (LED) display panels, side view brightness of the LED display panel is high such that an entire side view image quality of the splicing display panel is affected.

During research and practice of the conventional technologies, the inventor of the present application has discovered that attaching a conventional light grating film to a LED display panel results in black images of side view images of the LED display panel at a certain angle.

SUMMARY OF THE INVENTION

An embodiment of the present application provides a display panel and a splicing display panel that can thin a thickness of the display panel and lower side view brightness.

The embodiment of the present application provides a display panel, comprising:
  a display panel main body; and
  a light grating layer formed on the display panel main body, wherein the light grating layer comprises a plurality of light gratings, the light gratings are arranged at intervals along a first direction, the light gratings are arranged at intervals along a second direction, and the first direction intersects the second direction.

Optionally, in some embodiments of the present application, the display panel main body comprises:
  a driver substrate;
  a light emitting device disposed on the driver substrate;
  an encapsulation layer covering the light emitting device; and
  a planarization layer formed on the encapsulation layer;
  wherein the light grating layer is formed on the planarization layer.

Optionally, in some embodiments of the present application, the light gratings extend along a first direction.

Optionally, in some embodiments of the present application, the light grating layer further comprises a connection body; along the first direction, the connection body is connected between adjacent two of the light gratings; and a thickness of the connection body is less than a thickness of the light grating.

Optionally, in some embodiments of the present application, the light gratings comprise a plurality of first light gratings and a plurality of second light gratings, and the first light gratings extend along the first direction, the first light gratings are arranged at intervals along the first direction to form first lines; and
  the second light gratings extend along the second direction, and the second light gratings are arranged along at intervals the second direction to form second lines.

Optionally, in some embodiments of the present application, at least one of the second light gratings is located between adjacent two of the first lines; and at least one of the first light gratings is located between adjacent two of the second lines.

Optionally, in some embodiments of the present application, along the first direction, a first aperture is located between adjacent two of the first light gratings; and along the second direction, the second light gratings are disposed to correspond to the first apertures;
  along the second direction, a second aperture is located between adjacent two of the second light gratings; and along the first direction, the first light gratings are disposed to correspond to the second apertures; and
  along the second direction, at least some of the first apertures correspondingly form at least one first light channel; along the first direction, at least some of the second apertures correspondingly form at least one second light channel.

Optionally, in some embodiments of the present application, at intersecting positions between the first lines and the second lines, the first light gratings and the second light gratings are connected or disposed at an interval.

Optionally, in some embodiments of the present application, the display panel main body further comprises a color filter layer, the color filter layer is formed on the encapsulation layer, and the planarization layer is formed on the color filter layer.

Optionally, in some embodiments of the present application, the light grating layer comprises a first region located in a middle region and a second region disposed on two sides of the first region, and an arrangement density of the light gratings in the first region is less than an arrangement density of the light gratings in the second region.

Optionally, in some embodiments of the present application, along the second direction, a distance between the light gratings in the first region is greater than a distance between the light gratings in the second region.

Accordingly, the embodiment of the present application further provides a splicing display panel, comprising:
  at least two first display panels spliced, wherein a gap is defined between adjacent two of the first display panels; and
  at least one second display panel disposed on light exiting surfaces or light incident surfaces of adjacent two of the first display panels and shielding the gap, wherein the second display panel is the display panel of any one of the above embodiments;
  wherein side view brightness of the display panel main body is greater than side view brightness of the first display panel.

For example, the second display panel comprises a display panel main body and a light grating layer, the light grating layer is formed on the display panel main body;
  the light grating layer comprises a plurality of light gratings, the light gratings are arranged at intervals along a first direction, the light gratings are arranged at intervals along a second direction, and the first direction intersects the second direction.

Optionally, in some embodiments of the present application, the first display panel is a liquid crystal display panel, and the display panel main body comprises:
a driver substrate;
a light emitting device disposed on the driver substrate;
an encapsulation layer covering the light emitting device;
a color filter layer formed on the encapsulation layer, and
a planarization layer formed on the color filter layer;
wherein the light grating layer is formed on the planarization layer.

Optionally, in some embodiments of the present application, the light gratings extend along a first direction.

Optionally, in some embodiments of the present application, the light grating layer further comprises a connection body; along the first direction, the connection body is connected between adjacent two of the light gratings; and a thickness of the connection body is less than a thickness of the light grating.

Optionally, in some embodiments of the present application, the light gratings comprise a plurality of first light gratings and a plurality of second light gratings, and the first light gratings extend along the first direction, the first light gratings are arranged at intervals along the first direction to form first lines; and
the second light gratings extend along the second direction, and the second light gratings are arranged along at intervals the second direction to form second lines.

Optionally, in some embodiments of the present application, at least one of the second light gratings is located between adjacent two of the first lines; and at least one of the first light gratings is located between adjacent two of the second lines.

Optionally, in some embodiments of the present application, along the first direction, a first aperture is located between adjacent two of the first light gratings; and along the second direction, the second light gratings are disposed to correspond to the first apertures;
along the second direction, a second aperture is located between adjacent two of the second light gratings; and along the first direction, the first light gratings are disposed to correspond to the second apertures; and
along the second direction, at least some of the first apertures correspondingly form at least one first light channel; along the first direction, at least some of the second apertures correspondingly form at least one second light channel.

Optionally, in some embodiments of the present application, at intersecting positions between the first lines and the second lines, the first light gratings and the second light gratings are connected or disposed at an interval.

Optionally, in some embodiments of the present application, the light grating layer comprises a first region located in a middle region and a second region disposed on two sides of the first region, and an arrangement density of the light gratings in the first region is less than an arrangement density of the light gratings in the second region.

The embodiment of the present application provides the display panel and the splicing display panel. The display panel comprises a display panel main body and a light grating layer. The light grating layer is formed on the display panel main body. The light grating layer comprises a plurality of light gratings, and the light gratings are arranged at intervals along a first direction. The light gratings are arranged at intervals along a second direction, and the first direction intersects the second direction.

The embodiment of the present application uses the light grating layer formed on the display panel main body, namely, the light grating layer is integrated on the display panel main body to achieve thinning effect of the display panel. Furthermore, a plurality of light gratings are arranged at intervals respectively along a first direction and a second direction, which can lower side view brightness.

Furthermore, it should be explained that when side view brightness of a certain viewing angle is lower than a threshold, the viewing angle is an invisible viewing angle for a user, namely, under the viewing angle, the user is unable to see display contents of the display panel. Therefore, reducing the side view brightness of the display panel can achieve an effect of reducing the viewing angle to a certain degree.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device.

The embodiment of the present application provides a display panel and a splicing display panel, which will be described in detail as follows. It should be understood that a describing order of the following embodiments has no limit to a preferable order of the embodiments.

It should be explained that Optionally, splicing display panel comprises at least two first display panels and at least one second display panel. The at least two first display panels are spliced, and a gap is defined between adjacent two of the first display panels. The second display panel is disposed on adjacent two of the first display panels and shields the gap. The second display panel comprises a display panel main body and a light grating layer. The light grating layer is disposed on the display panel main body. Front view brightness of the display panel main body is greater than front view brightness of the first display panel.

Figure 1:
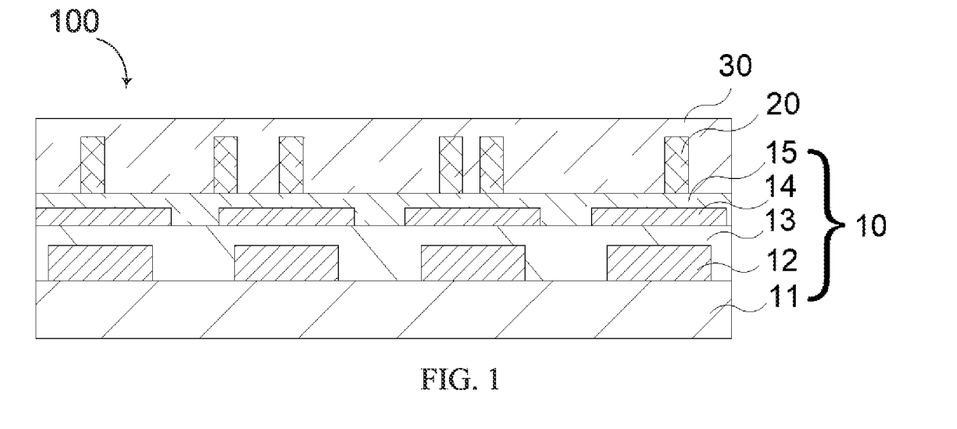
FIG. 1 is a schematic structural view of a display panel provided by a first embodiment of the present application.
Figure 2:
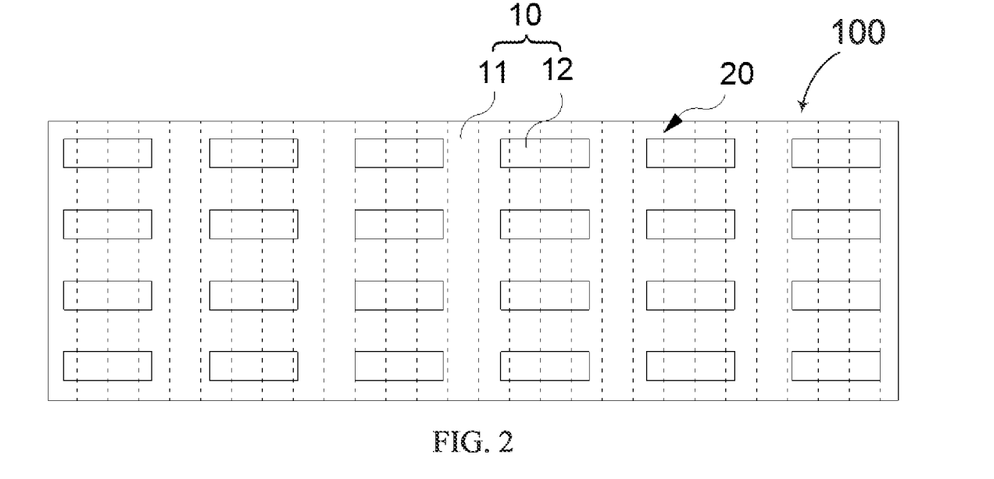
FIG. 2 is a schematic structural top view of the display panel provided by the first embodiment of the present application.
Figure 3:
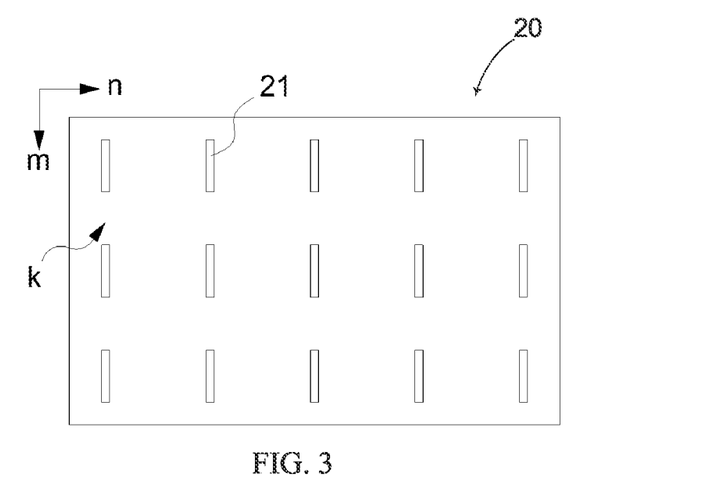
FIG. 3 is a schematic structural top view of a light grating layer of the display panel provided by the first embodiment of the present application.

With reference to FIGS. 1 to 3, the first embodiment of the present application provides a display panel 100 comprising a display panel main body 10 and a light grating layer 20. The light grating layer 20 is formed on the display panel main body 10. The light grating layer 20 comprises a plurality of light gratings 21. The light gratings 21 are arranged at intervals along a first direction m. Also, the light gratings 21 are arranged at intervals along a second direction n. The first direction m intersects the second direction n.

The embodiment of the present application forms the light grating layer 20 on the display panel main body 10. Namely, the light grating layer 20 is integrated on the display panel main body 10 to achieve a thinning effect of the display panel 100. Also, the light gratings 21 are arranged at intervals respectively along the first direction m and the second direction n, which can lower side view brightness.

Optionally, the light grating layer 20 can be directly formed on the display panel main body 10 by a transferring process or a punching process.

Because along both the first direction m and the second direction n, the light gratings 21 are arranged at intervals, an aperture k is defined between namely adjacent ones of the light gratings 21, some of side light can pass through the aperture k, some of side light is blocked by the light gratings 21, which achieves lowered side view brightness without the side view brightness being zero. Namely, under a condition of a large viewing angle, side visibility is still available.

Furthermore, it should be explained that when side view brightness of a certain viewing angle is lower than a threshold, the viewing angle is an invisible viewing angle for a user, namely, under the viewing angle, the user is unable to see display contents of the display panel. Therefore, reducing the side view brightness of the display panel 100 can achieve an effect of reducing the viewing angle to a certain degree.

Optionally, the first direction m is perpendicular to the second direction n. In some embodiments, the first direction m is non-perpendicular to the second direction n, for example an included angle between the first direction m and the second direction n can be 45 degrees, 60 degrees, or 120 degrees.

Optionally, the display panel main body 10 can be a LED display panel, for example, a micro-LED display panel, a mini-LED display panel, a quantum dot LED (Q-LED) display panel, or an organic light emitting diode (OLED) display panel; or it can be a liquid crystal display panel.

Optionally, the display panel main body 10 comprises a driver substrate 11, a light emitting device 12, an encapsulation layer 13, a color filter layer 14, and a planarization layer 15.

The light emitting device 12 is disposed on the driver substrate 11. The encapsulation layer 13 covers the light emitting device 12. The color filter layer 14 is formed on the encapsulation layer 13. The planarization layer 15 is formed on the color filter layer 14. The light grating layer 20 is formed on the planarization layer 15.

Optionally, the light emitting device 12 emits white light, for example, the light emitting device 12 can be a white light LED light emitting device or a blue light LED light emitting device equipped with a light conversion film. The color filter layer 14 is configured to filter light emitted from the light emitting device 12 to form red, green, or red light. Optionally, the color filter layer 14 comprises a red color resist, a green color resist, and a blue color resist.

Optionally, the driver substrate 11 comprises a base and a thin film transistor disposed on the base. The thin film transistor a top gate type, bottom gate type, or a dual-gate type.

In some embodiments, the display panel main body 10 can also skip the color filter layer 14. Namely, the light emitting device 12 comprises a light emitting device emitting red light, a light emitting device emitting green light, and a light emitting device emitting blue light. Alternatively, the light emitting device 12 is a light emitting device emitting singular color light, a light conversion layer can be formed on the light emitting device to emit blue, green, or blue light.

Optionally, the display panel 100 can further comprise a protective layer 30, and the protective layer 30 covers the light grating layer 20.

Optionally, with reference to FIG. 3, the light gratings 21 extends along the first direction m. A length of the light grating 21 along the first direction m is greater than a width of the light grating 21 along the second direction n such that the light grating 21 can shield more side light along the first direction m when applied to the display panel. Therefore, side view brightness of the first direction m is less than side view brightness of the second direction n. Because the side view brightness of the first direction m is different from that of the second direction n, it is convenient to have bonding configuration along different directions according to different demands to improve adaptability of the light grating layer.

Optionally, along the first direction m, an aperture width between adjacent two of the light gratings 21 is a first width. Along the second direction n, an aperture width of adjacent two of the light gratings 21 is a second width. The first width is less than the second width such that less side light passes through the second direction n when it is applied to the display panel. Therefore, the side view brightness of the first direction m is greater than the side view brightness of the second direction n.

Optionally, a material of the light gratings 21 can be a black opaque material, for example, it can be an inorganic metal material such as chromium (Cr), molybdenum (Mo), manganese (Mn), etc., and can be a metal oxide material such as $CrO_x$, $MoO_x$, $MnO_2$, etc., or a mixture material formed by metal and metal oxide. Also, it can be an organic black resin material such as black polystyrene, black photoresist, etc.

Optionally, a shape of the light grating 21 can be a rectangle, trapezoid, or other shape.

Optionally, a width of the light grating 21 is greater than or equal to 8 microns, for example, 8 microns, 9 microns, or 10 microns. A length of the light gratings 21 is from 35 microns to 75 microns, for example, 35 microns, 45 microns, 55 microns, 65 microns or 75 microns. A thickness of the light grating 21 is from 50 microns to 130 microns, for example, 50 microns, 70 microns, 90 microns, 110 microns or 130 microns.

Optionally, the light gratings 21 are arranged evenly in the light grating layer 20.

Figure 4:
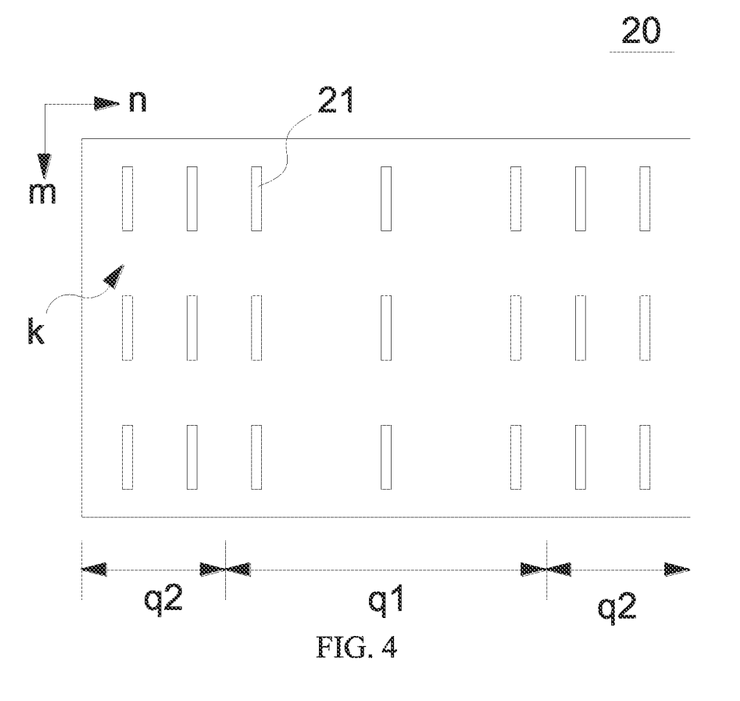
FIG. 4 is another schematic structural top view of the light grating layer of the display panel provided by the first embodiment of the present application.

Optionally, with reference to FIG. 4, in another top view structure of the first embodiment, the light grating layer 20 comprises a first region q1 located in a middle region and a second region q2 disposed on two sides of the first region q1. An arrangement density of the light gratings 21 located in the first region q1 is less than an arrangement density of the light gratings 21 located in the second region q2.

When the embodied light grating layer 20 are applied to a splicing display panel, the light gratings 21 in different arrangement densities are disposed divisionally such that the front view brightness of the first region q1 is greater than the front view brightness of the second region q2 to make entire brightness of the splicing display panel transit smoothly.

Optionally, along the second direction n, a distance between the light gratings 21 located in the first region q1 is greater than a distance between the light gratings 21 located in the second region q2.

Optionally, a height of the light grating 21 located in the first region q1 is less than a height of the light grating 21 located in the second region q2. As such configuration, side view brightness in the first region q1 is greater than side view brightness in the second region q2.

A height direction is a direction perpendicular to plane mn.

Optionally, a method for manufacturing the display panel 100 of the embodiment of the present application has the following steps:
  a step B1 comprising providing a display panel main body 10; and
  a step B2 comprising forming a light grating layer 20 on the display panel main body 10.

The step B2 comprises:
  a step B21 comprising forming a light grating material layer on the display panel main body 10.

Optionally, a material of the light gratings can be a black opaque material, for example, it can be an inorganic metal material such as chromium (Cr), molybdenum (Mo), manganese (Mn), etc., and can be a metal oxide material such as $CrO_x$, $MoO_x$, $MnO_2$, etc., or a mixture material formed by metal and metal oxide. Also, it can be an organic black resin material such as black polystyrene, black photoresist, etc.

A step B22 comprises punching the light grating material layer to form light gratings 21.

Optionally, the step B22 comprises steps as follows:
  a step B221 comprising by first punching die punching the light grating material layer to form the first light gratings 211;
  a step B222 comprising by second punching die punching the light grating material layer to form the second light gratings 212;
  a step B223 comprising removing portions other than the first light gratings 211 and the second light gratings 212 in the light grating material layer.

First punching holes, patterned as the first light gratings 211, are defined in the first punching die. second punching holes, patterned as the second light gratings 212, are defined in the second punching die.

In some embodiments, a single punching die can also be used to punch the light grating material layer to form the first light gratings 211 and the second light gratings 212, to achieve an effect of saving the punching die.

The method for manufacturing the display panel 100 of the embodiment of the present application, further comprises B3 step:
  sequentially stacking and disposing a protective layer on the light grating layer 20.

As such, manufacturing processes of the display panel 100 of the embodiment of the present application are completed.

In some embodiments, the light grating layer 20 can also be formed on the display panel main body 10 by a transferring method.

Figure 5:
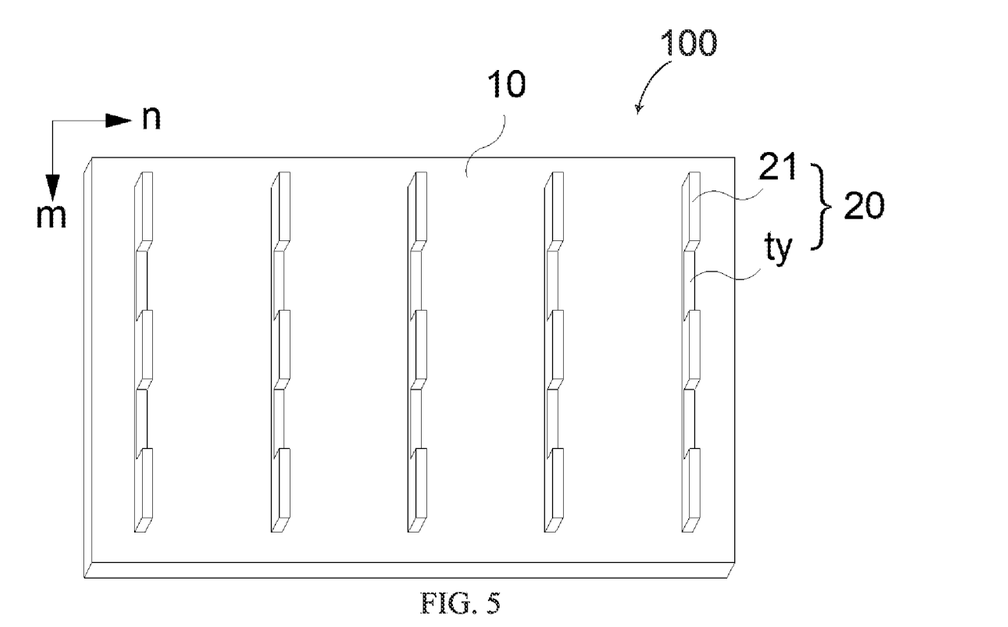
FIG. 5 is a schematic structural top view of the light grating layer of the display panel provided by a second embodiment of the present application.

With reference to FIG. 5, on the basis of the first embodiment of the present application, the light grating layer 20 of the display panel 100 of a second embodiment further comprises connection bodies ty. Along the first direction m, the connection body ty is connected between adjacent two of the light gratings 21. A height of the connection body ty is less than a height of the light grating 21.

The connection bodies ty with the lower height are connected among the light gratings 21. When using the transferring process, connection bodies ty are separated from the light gratings 21. Furthermore, the connection body ty can also shield some of light at a large viewing angle to further lower brightness at the large viewing angle.

Optionally, the connection body ty and the light gratings 21 are disposed on the same layer and are formed integrally. A material of the connection body ty is the same as a material of the light gratings 21.

Figure 6:
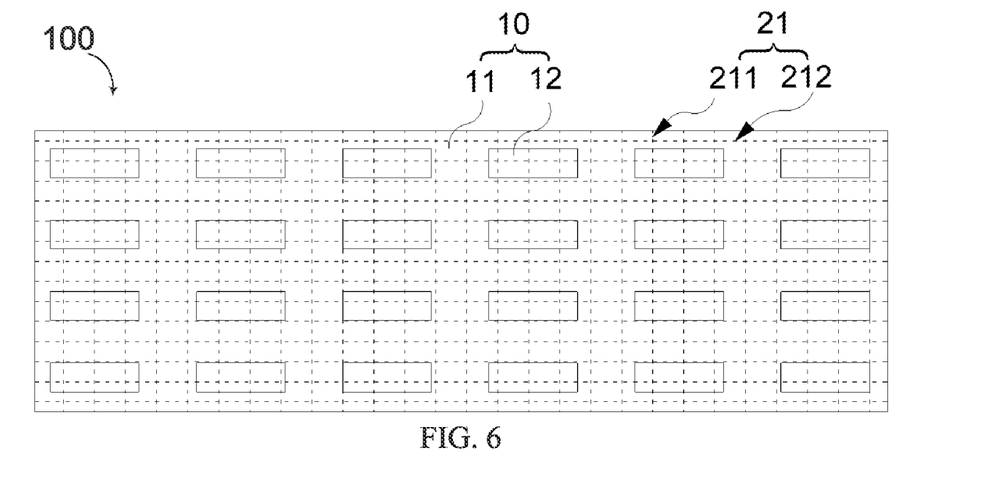
FIG. 6 is a schematic structural top view of the display panel provided by a third embodiment of the present application.
Figure 7:
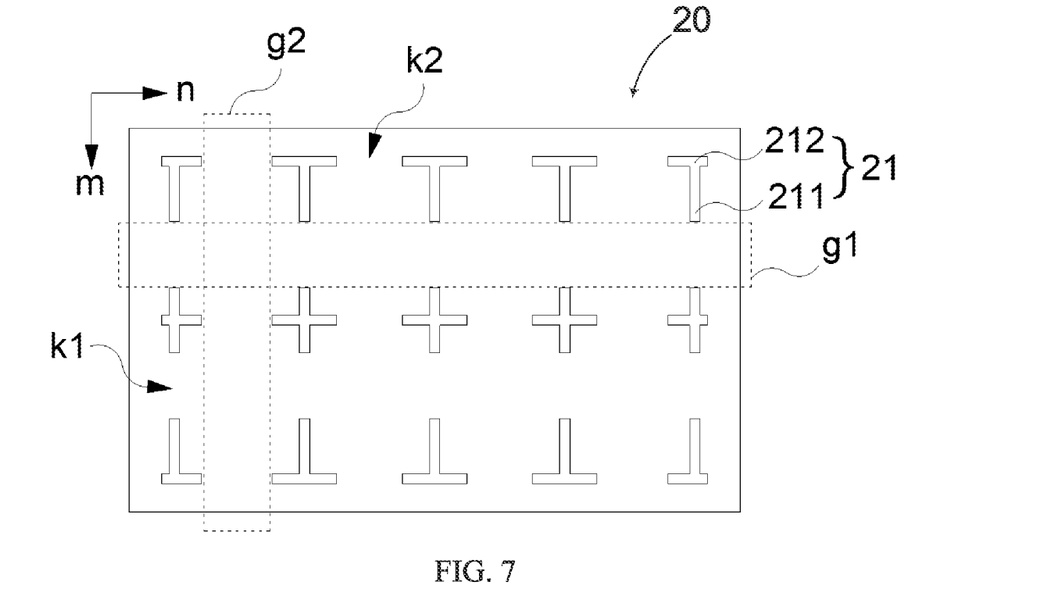
FIG. 7 is a schematic structural top view of the light grating layer of the display panel provided by the third embodiment of the present application.

With reference to FIGS. 6 and 7, on the basis of the first embodiment, in the display panel 100 of the third embodiment, the light gratings 21 of the light grating layer 20 comprises two states.

The light gratings 21 comprises a plurality of first light gratings 211 and a plurality of second light gratings 212. The first light gratings 211 extend along the first direction m. The first light gratings 211 are arranged at intervals along the first direction m. the first light gratings 211 are arranged at intervals along the second direction n.

The second light gratings 212 extend along the second direction n. the second light gratings 212 are arranged at intervals along the first direction m. the second light gratings 212 are arranged at intervals along the second direction n.

The display panel 100 of the third embodiment uses the first light gratings 211 cooperating with the second light gratings 212 to further lower side view brightness of the first direction m.

Optionally, the first light gratings 211 are connected to the second light gratings 212. Namely, one of the first light gratings 211 intersects and is connected to one of the second light gratings 212.

Along the first direction m, a first aperture k1 is defined between adjacent two of the first light gratings 211. Along the second direction n, a second aperture k2 is defined between adjacent two of the second light gratings 212.

At least some of the first apertures k1 form a first light channel g1 along the second direction n. At least some of the second apertures k2 form a second light channel g2 along the first direction m.

The display panel 100 of the third embodiment uses the configuration of the adjacent and intersecting first light gratings 211 and second light gratings 212 to form a plurality of first channels g1 and a plurality of second channels g2 such that side view brightness of the light grating layer 20 along the first direction m and the second direction n tends to be uniform.

Figure 8:
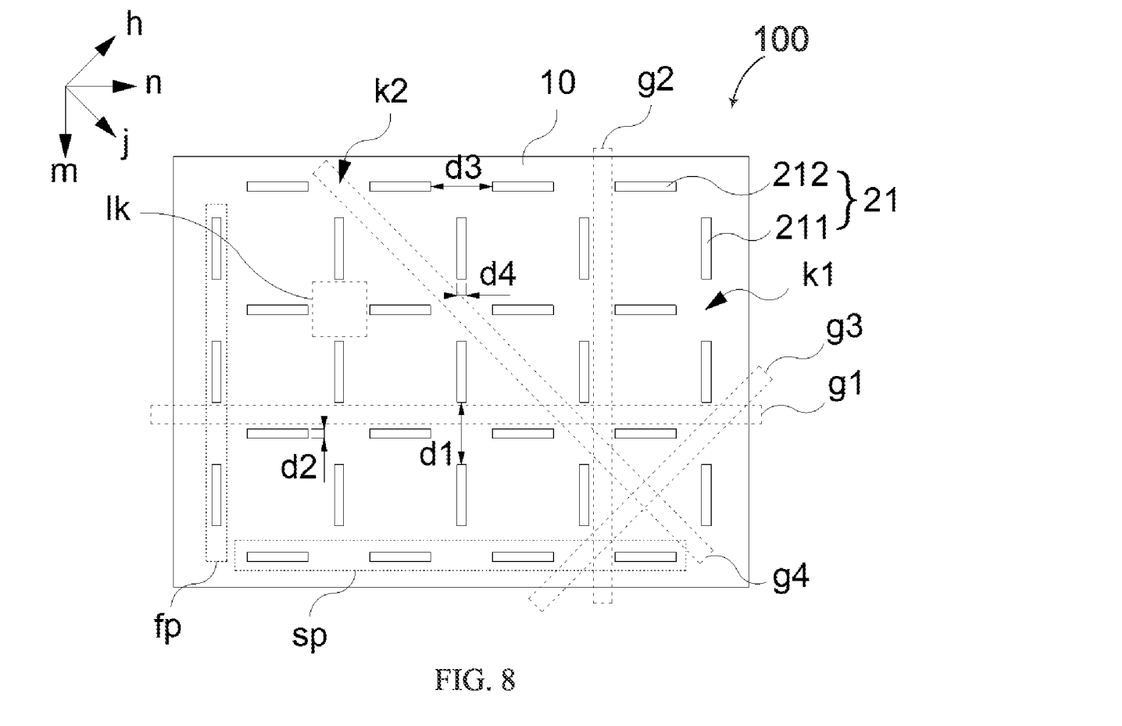
FIG. 8 is a schematic structural top view of the light grating layer of the display panel provided by a fourth embodiment of the present application.

With reference to FIG. 8, a difference of the display panel 100 of the fourth embodiment from that of the first embodiment is that: the light gratings 21 comprises the first light gratings 211 and the second light gratings 212. The first light gratings 211 extend along the first direction m, and the first light gratings 211 are arranged at intervals along the first direction m to form first lines fp.

The second light gratings 212 extends along the second direction n, and the second light gratings 212 are arranged at intervals along the second direction n to form second lines sp.

At least one second light grating 212 is disposed between adjacent two of the first lines fp. At least one first light grating 211 is disposed between adjacent two of the second lines sp.

Along the first direction m, the first aperture k1 is disposed between adjacent two of the first light gratings 211. Along the second direction n, the second light gratings 212 are disposed to correspond to the first apertures k1.

Along the second direction n, the second aperture k2 is disposed between adjacent two of the second light gratings 212. Along the first direction m, the first light gratings 211 are disposed to correspond to the second apertures k2.

Along the second direction n, at least some of the first apertures k1 correspondingly form at least one first light channel g1. Along the first direction m, at least some of the second apertures k2 correspondingly form at least one second light channel g2.

Optionally, at intersecting positions first lines fp and second lines sp, the first light gratings 211 are connected to or disposed at intervals from the second light gratings 212.

In the fourth embodiment, the first light gratings 211 and the second light gratings 212 are disposed at intervals to increase a number of the light channels. Furthermore, the first light gratings 211 correspond to the second apertures k2, and the second light gratings 212 correspond to the first apertures k1 to improve uniformity of light passing through the light grating layer 20.

In some embodiments, the first light gratings 211 can also be disposed between two of the second light gratings 212. The second light gratings 212 can be disposed between two of the first light gratings 211.

Optionally, in the fourth embodiment, along the first direction m, a length d1 of the first aperture k1 is greater than a width d2 of the second light grating 212. Along the second direction n, the first apertures k1 are arranged to form at least one first light channel g1.

In the fourth embodiment, a connection line between a center of the first aperture k1 and a center of the second light grating 212 extends along the second direction n. Along the second direction n, a light channel formed by the first apertures k1 is divided by the second light gratings 212 into two first light channels g1 to improve uniformity of passing light.

Optionally, along the second direction n, a length d3 of the second aperture k2 is greater than a width d4 of the first light grating 211.

Along the first direction m, the second apertures k2 are arranged to form at least one second light channel g2.

In the fourth embodiment, a connection line between a center of the second apertures k2 and a center of the first light gratings 211 extends along the first direction m. Along the first direction m, a light channel formed by the second apertures k2 is divided by the first light gratings 211 into two second light channels g2 to improve uniformity of passing light.

Optionally, the first aperture k1 overlaps the second aperture k2 to form a hollow region Ik. The hollow regions Ik along a third direction h are arranged to form a third light channel g3. The hollow regions Ik along a fourth direction j are arranged to form a fourth light channel g4.

Optionally, sizes of the first apertures k1 and the second apertures k2 are equal. Each two of the first direction m, the second direction n, the third direction h and the fourth direction j are intersected.

Optionally, the third direction h is perpendicular to the fourth direction j. A length of the first light gratings 211 is equal to a length of the second light gratings 212. The width d2 of the first light grating 211 is equal to the width d4 of the second light grating 212. The length d1 of the first apertures k1 along the first direction m is equal to a length of the first apertures k1 along the second direction n. The length d1 of the first apertures k1 is equal to the length d3 of the second apertures k2. Along the first direction m, the second light gratings 212 are disposed coaxially, the first light gratings 211 are disposed coaxially; along the second direction n, the first light gratings 211 are disposed coaxially, the second light gratings 212 are disposed coaxially.

A plurality of third light channels g1 and a plurality of fourth light channels g4 are defined in the fourth embodiment to increase light emitting brightness at a tilt viewing angle such that brightness of the tilt viewing angle is consistent with a horizontal viewing angle and a vertical viewing angle as possible.

Figure 9:
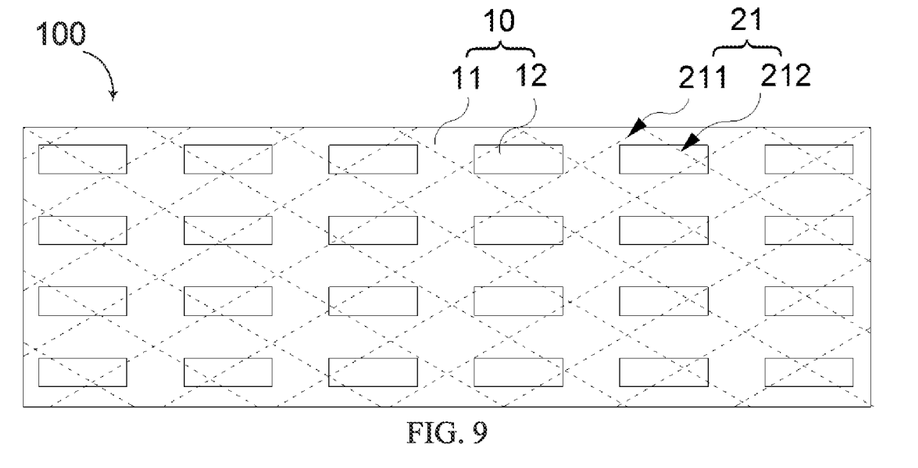
FIG. 9 is a schematic structural top view of the display panel provided by a fifth embodiment of the present application.
Figure 10:
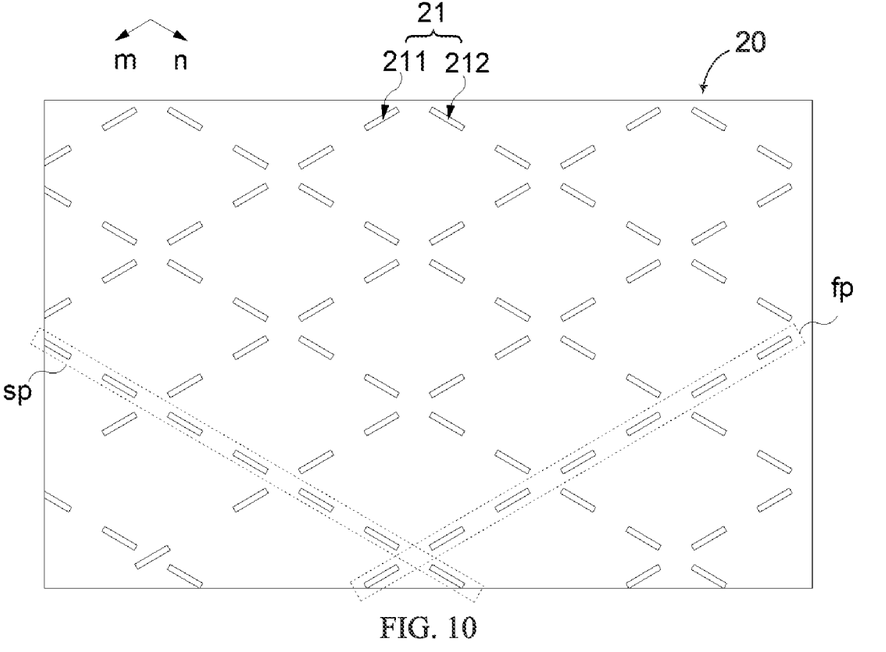
FIG. 10 is a schematic structural top view of the light grating layer of the display panel provided by a fifth embodiment of the present application.

With reference to FIGS. 9 and 10, a difference of the display panel 100 of the fifth embodiment from the display panel 100 of the fourth embodiment is that:

An included angle between the first direction m and the second direction n is an obtuse angle, for example, it can be 120 degrees. The second light grating 212 is disposed between adjacent two of the first lines fp. The first light gratings 211 is disposed between adjacent two of the second lines sp.

Compared to the display panel 100 of the fourth embodiment, a density of the light gratings 21 in the display panel 100 in the fifth embodiment is lower and can improve the light emitting brightness of the display panel 100. Namely, the embodiment of the present application can adjust a distance between the light gratings 21 to further adjust the light emitting brightness of the display panel 100.

Figure 11:
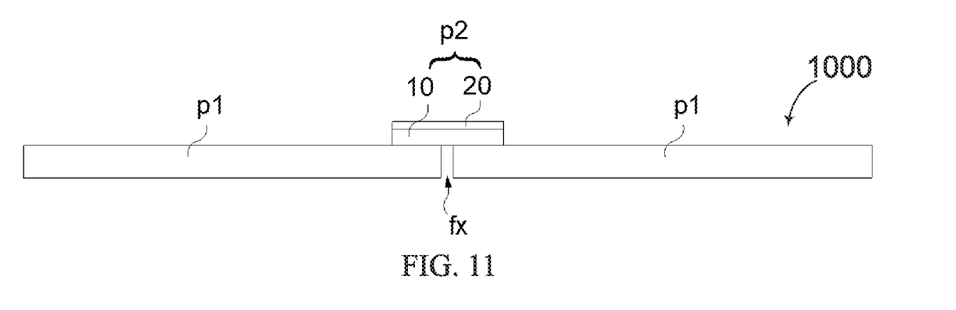
FIG. 11 is a schematic structural view of a splicing display panel provided by the embodiment of the present application.

Accordingly, with reference to FIG. 11, the embodiment of the present application also provides a splicing display panel 1000, comprising at least two first display panels p1 and at least one second display panel p2.

The at least two first display panels p1 are spliced, a gap fx is defined between adjacent two of the first display panels p1.

The second display panel p2 is disposed on light exiting surfaces of adjacent two of the first display panels p1 and shields the gap fx.

The second display panel p2 is the display panel 100 of any one of the above embodiments.

Side view brightness of the display panel main body 10 is greater than side view brightness of the first display panel p1.

A splicing direction of adjacent two of the first display panels p1 intersects the first direction m. Such configuration ensures side view brightness of the second display panel p2. Also, in the entire the splicing the display panel 1000, a side view brightness of the second display panel p2 is guaranteed not to be 0.

Optionally, the splicing direction of the first display panel p1 is perpendicular to the first direction m such that an extension direction of some of light channels is consistent with the splicing direction.

The second display panel p2 of the splicing the display panel 1000 of the embodiment of the present application forms the light grating layer 20 on the display panel main body 10 to lower side view brightness and the front view brightness of the second display panel p2 such that the entire side view brightness and front view brightness of the splicing the display panel 1000 tend to be consistent.

Furthermore, it should be explained that when side view brightness of a certain viewing angle is lower than a threshold, the viewing angle is an invisible viewing angle for a user, namely, under the viewing angle, the user is unable to see display contents of the display panel. Therefore, reducing the side view brightness of the display panel 100 can achieve an effect of reducing the viewing angle to a certain degree.

The viewing angle of the second display panel p2 is greater than the viewing angle of the first display panel p1 such that the configuration of the light grating layer 20 also achieves an effect of making the viewing angles of the first display panel p1 and the second display panel p2 tend to be consistent.

Optionally, the first display panel p1 can be a liquid crystal display panel, but is not limited thereto. A brightening film can also be disposed on a light exiting side of the first display panel p1. The display panel main body 10 comprises a color filter layer 14 disposed on the light emitting device 12.

Forming the color filter layer 14 in the second display panel p2 can make gamuts of the first display panel p1 and the second display panel p2 tend to be consistent.

Figure 12:
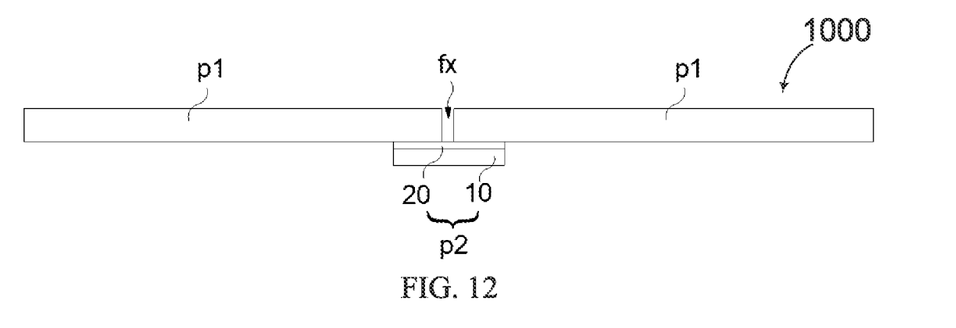
FIG. 12 is another schematic structural view of the splicing display panel provided by the embodiment of the present application.

With reference to FIG. 12, in some embodiments, the second display panel p2 can also be disposed on light incident surfaces of adjacent two of the first display panels p1.

It should be explained that the light incident surface is disposed opposite to the light exiting surface. namely, the light exiting surface is a front surface of the first display panel p1, and the light incident surface is a rear surface of the first display panel p1.

Optionally, the second display panel p2 is disposed in a non-display region of the first display panel p1. A portion of the second display panel p2 corresponding to the non-display region is transparent.

The second display panel p2 is disposed on the rear surface of the first display panel p1. Because some film layer of the first display panel p1 in the non-display region has a certain light consuming characteristic to reduce light exiting brightness of the second display panel p2, a number of the light gratings 21 in the light grating layer 20 is further decreased, which reduces difficulty of manufacturing light grating layer.

The display panel and the splicing display panel provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A splicing display panel, comprising:
   at least two first display panels spliced, wherein a gap is defined between adjacent two of the first display panels; and
   at least one second display panel disposed on light exiting surfaces or light incident surfaces of adjacent two of the first display panels and shielding the gap, wherein the second display panel comprises a display panel main body and a light grating layer, and the light grating layer is formed on the display panel main body;
   wherein side view brightness of the display panel main body is greater than side view brightness of the first display panel;
   wherein the light grating layer comprises a plurality of light gratings, the light gratings are arranged at intervals along a first direction, the light gratings are arranged at intervals along a second direction, and the first direction intersects the second direction.

2. The splicing display panel according to claim 1, wherein the first display panel is a liquid crystal display panel, and the display panel main body comprises:
   a driver substrate;
   a light emitting device disposed on the driver substrate;
   an encapsulation layer covering the light emitting device;
   a color filter layer formed on the encapsulation layer, and
   a planarization layer formed on the color filter layer;
   wherein the light grating layer is formed on the planarization layer.

3. The splicing display panel according to claim 1, wherein the light gratings extend along a first direction.

4. The splicing display panel according to claim 3, wherein the light grating layer further comprises a connection body; along the first direction, the connection body is connected between adjacent two of the light gratings; and a thickness of the connection body is less than a thickness of the light grating.

5. The splicing display panel according to claim 1, wherein the light gratings comprise a plurality of first light gratings and a plurality of second light gratings, and the first light gratings extend along the first direction, the first light gratings are arranged at intervals along the first direction to form first lines; and
   the second light gratings extend along the second direction, and the second light gratings are arranged along at intervals the second direction to form second lines.

6. The splicing display panel according to claim 5, wherein at least one of the second light gratings is located between adjacent two of the first lines; and at least one of the first light gratings is located between adjacent two of the second lines.

7. The splicing display panel according to claim 6, wherein along the first direction, a first aperture is located between adjacent two of the first light gratings; and along the second direction, the second light gratings are disposed to correspond to the first apertures;

along the second direction, a second aperture is located between adjacent two of the second light gratings; and along the first direction, the first light gratings are disposed to correspond to the second apertures; and along the second direction, at least some of the first apertures correspondingly form at least one first light channel; along the first direction, at least some of the second apertures correspondingly form at least one second light channel.

8. The splicing display panel according to claim 7, wherein at intersecting positions between the first lines and the second lines, the first light gratings and the second light gratings are connected or disposed at an interval.

9. The splicing display panel according to claim 1, wherein the light grating layer comprises a first region located in a middle region and a second region disposed on two sides of the first region, and an arrangement density of the light gratings in the first region is less than an arrangement density of the light gratings in the second region.

* * * * *